(12) United States Patent
Suzuki et al.

(10) Patent No.: US 12,137,620 B2
(45) Date of Patent: Nov. 5, 2024

(54) STORAGE DEVICE

(71) Applicant: Kioxia Corporation, Tokyo (JP)

(72) Inventors: Kunifumi Suzuki, Yokkaichi Mie (JP); Yuuichi Kamimuta, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 506 days.

(21) Appl. No.: 17/549,236

(22) Filed: Dec. 13, 2021

(65) Prior Publication Data

US 2022/0399489 A1 Dec. 15, 2022

(30) Foreign Application Priority Data

Jun. 11, 2021 (JP) ................................. 2021-097861

(51) Int. Cl.
*H01L 23/48* (2006.01)
*H10B 63/00* (2023.01)
*H10N 70/00* (2023.01)
*H10N 70/20* (2023.01)

(52) U.S. Cl.
CPC ......... *H10N 70/235* (2023.02); *H01L 23/481* (2013.01); *H10B 63/84* (2023.02); *H10N 70/8828* (2023.02)

(58) Field of Classification Search
CPC .... H01L 23/481; H10B 63/84; H10N 70/235; H10N 70/8828
See application file for complete search history.

(56) References Cited

U.S. PATENT DOCUMENTS

| | | | |
|---|---|---|---|
| 10,262,729 B2 | 4/2019 | Suzuki et al. | |
| 10,424,731 B2 | 9/2019 | Suzuki et al. | |
| 2007/0200108 A1 | 8/2007 | Noh et al. | |
| 2009/0201715 A1* | 8/2009 | Kreupl | H10B 63/80 257/E21.004 |
| 2009/0231913 A1 | 9/2009 | Tonomura et al. | |
| 2010/0200828 A1 | 8/2010 | Tominaga et al. | |
| 2016/0268503 A1 | 9/2016 | Suzuki et al. | |
| 2018/0277203 A1 | 9/2018 | Suzuki et al. | |
| 2021/0083008 A1* | 3/2021 | Kobayashi | H10N 70/063 |

FOREIGN PATENT DOCUMENTS

| | | |
|---|---|---|
| JP | 2007-235128 A | 9/2007 |
| JP | 2009-059902 A | 3/2009 |
| JP | 2012-009141 A | 1/2012 |
| JP | 2018-163718 A | 10/2018 |

* cited by examiner

*Primary Examiner* — Hoa B Trinh
(74) *Attorney, Agent, or Firm* — Foley & Lardner LLP

(57) ABSTRACT

A storage device 10 includes a phase change layer 40 containing tellurium, and a diffusion layer 50 containing at least one of germanium, silicon, carbon, tin, aluminum, gallium, and indium and disposed at a position adjacent to the phase change layer 40. The phase change layer 40 is capable of changing between a first state and a second state different from each other in electric resistance. The phase change layer 40 is in a crystal state in any of the first state and the second state. A length of the diffusion layer 50 in a direction orthogonal to a z direction is shorter than a length of the phase change layer 40 in the direction orthogonal to the z direction.

19 Claims, 13 Drawing Sheets

FIG.2
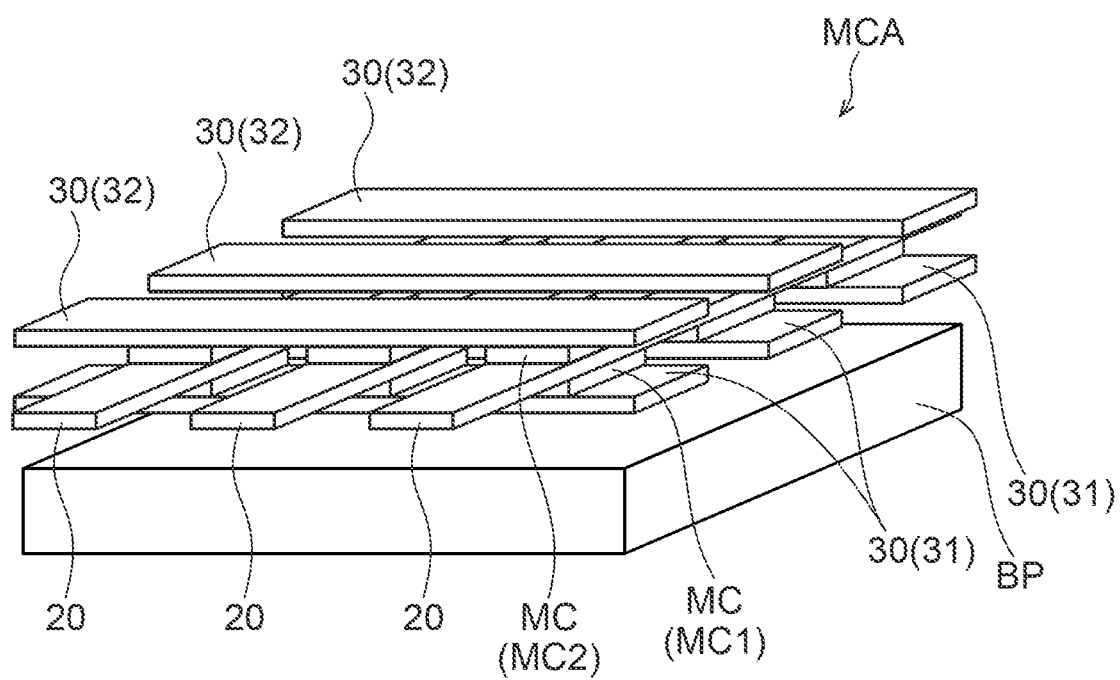
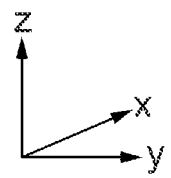

x····Ge x····Ge

STORAGE DEVICE

CROSS-REFERENCE TO RELATED APPLICATION

This application is based upon and claims the benefit of priority from Japanese Patent Application No. 2021-097861, filed on Jun. 11, 2021, the entire contents of which are incorporated herein by reference.

FIELD

Embodiments of the present invention relate to a storage device.

BACKGROUND

A storage device of a new scheme, which referred to as a "phase change memory", has been developed as a storage device used for an information instrument such as a cellular phone. As such a storage device, for example, a storage device that causes a phase change material to reversibly transition between a high-resistive non-crystal state and a low-resistive crystal state by applying a voltage pulse to the phase change material has been proposed. Moreover, a storage device that changes the distribution of a specific element (for example, Ge) contained in a phase change material by applying a voltage pulse to the phase change material, thus changing the electric resistance of the phase change material has also been proposed. In such a storage device, the electric resistance of the phase change material is stably maintained even after a power source is disconnected, and thus information corresponding to the electric resistance can be stored.

BRIEF DESCRIPTION OF THE DRAWINGS

FIG. 2 is a diagram illustrating the configuration of a memory cell array in FIG. 1;

DETAILED DESCRIPTION

Figure 1:
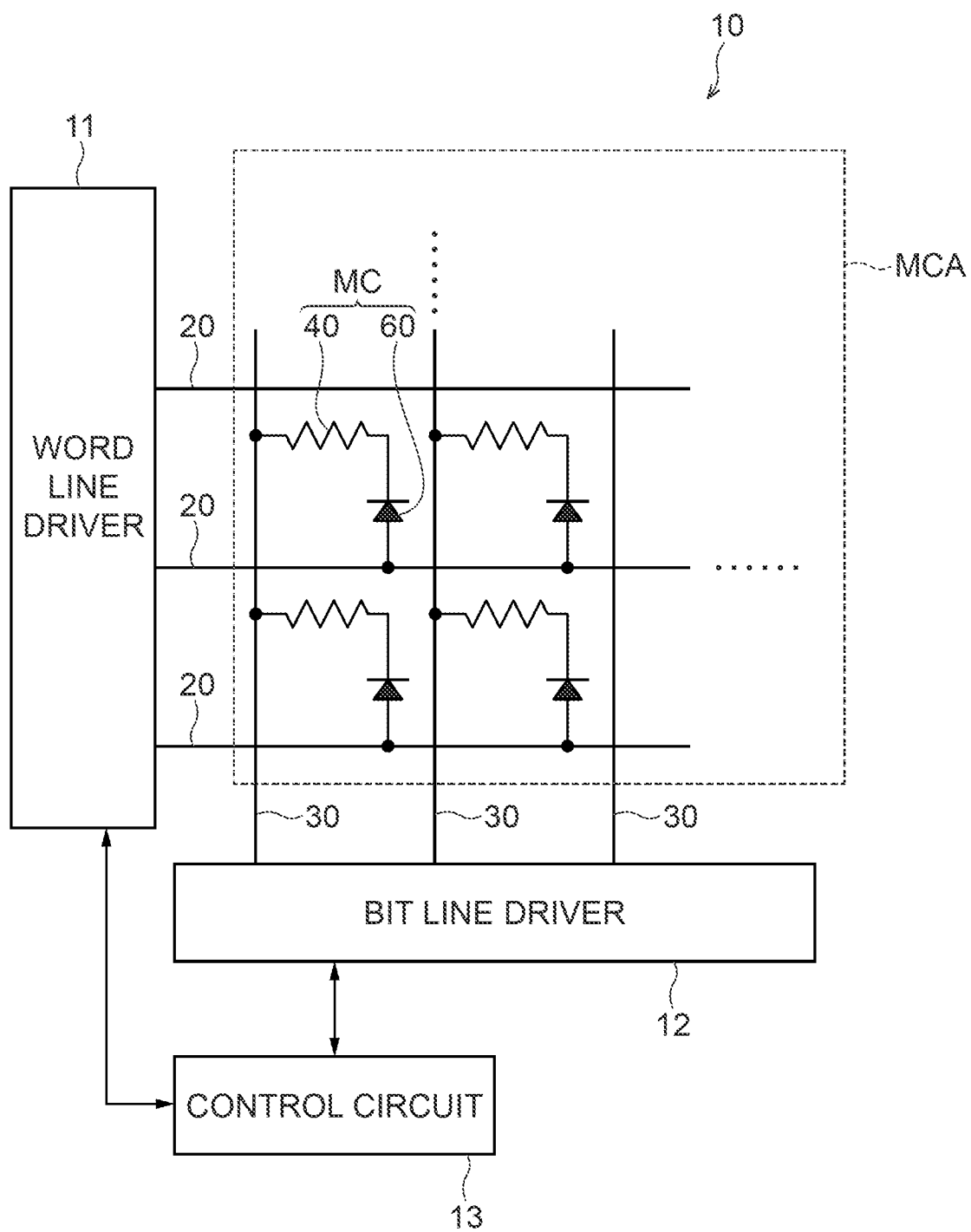
FIG. 1 is a diagram schematically illustrating the configuration of a storage device according to a first embodiment.

The present embodiments will be described below with reference to the accompanying drawings. To facilitate understanding of description, the same components in the drawings will be denoted by the same reference sign as much as possible, and duplicate description thereof will be omitted.

A first embodiment will be described below. A storage device 10 according to the present embodiment is an interface resistance random access phase change memory exploiting elemental segregation. As illustrated in FIG. 1, the storage device 10 includes a memory cell array MCA, a word line driver 11, a bit line driver 12, and a control circuit 13.

The memory cell array MCA is a part including a plurality of memory cells MC in which data is stored. The storage device 10 is provided with a plurality of word lines 20 and a plurality of bit lines 30. These lines are formed as a wiring layer for applying voltage to the memory cells MC. One end of each memory cell MC is connected to a word line 20, and the other end is connected to a bit line 30. As illustrated in FIG. 2, each memory cell MC is provided at a position where the corresponding word line 20 and the corresponding bit line 30 intersect each other. Note that FIG. 1 illustrates only some of the plurality of memory cells MC included in the memory cell array MCA.

Each memory cell MC includes a phase change layer 40 and a selector 60. As illustrated with an equivalent circuit in FIG. 1, the phase change layer 40 and the selector 60 are electrically connected in series between the corresponding word line 20 and the corresponding bit line 30. Note that, although FIG. 1 illustrates that the phase change layer 40 is disposed on the bit line 30 side and the selector 60 is disposed on the word line 20 side, disposition of the phase change layer 40 and the selector 60 is not limited thereto. In each of some or all memory cells MC, disposition of the phase change layer 40 and the selector 60 may be opposite to the disposition in FIG. 1.

The phase change layer 40 is a layer formed of a phase change material and is a part that stores information corresponding to the value of its electric resistance. In the present embodiment, the phase change material is a chalcogenide material made of antimony telluride ($Sb_2Te_3$). The material of the phase change layer 40 is not limited thereto but may be any other phase change material. The phase change material is preferably a compound containing at least tellurium.

The electric resistance (specifically, electric resistance at a vicinity part of an interface with a diffusion layer 50 to be described later) of the phase change layer 40 changes when a predetermined voltage pulse is applied to the phase change layer 40. As described later, the phase change layer 40 reversibly transitions between a first state in which the electric resistance is relatively high and a second state in which the electric resistance is relatively low in accordance with the waveform of the applied voltage pulse. Information (0 or 1) corresponding to the electric resistance of the phase change layer 40 is stored in each memory cell MC.

The selector 60 is a two-terminal switching element and has a non-linear current-voltage characteristic. Substantially no current flows through the selector 60 when voltage applied to both ends of the selector 60 is equal to or lower than a predetermined threshold value. Current abruptly flows through the selector 60 when voltage applied to both ends of the selector 60 exceeds the above-described threshold value. Since the selector 60 is provided in each memory cell MC, it is possible to flow current only to a phase change layer 40 as a data writing or erasure target, thereby changing the electric resistance of the phase change layer 40.

The word line driver 11 is a circuit for adjusting the potential of each word line 20. One end of each word line 20 is connected to the word line driver 11. The word line driver 11 includes a non-illustrated switch group for switching opening and closing between each word line 20 and a voltage generation circuit (not illustrated). Operation of the word line driver 11 is controlled by the control circuit 13 to be described later.

The bit line driver 12 is a circuit for adjusting the potential of each bit line 30. One end of each bit line 30 is connected to the bit line driver 12. The bit line driver 12 includes a non-illustrated switch group for switching opening and closing between each bit line 30 and a voltage generation circuit (not illustrated). The bit line driver 12 may include a circuit for acquiring data stored in each memory cell MC based on current flowing through the corresponding bit line 30. In addition, the bit line driver 12 may include a circuit for adjusting the potential of each bit line 30 in accordance with writing data. Operation of the bit line driver 12 is controlled by the control circuit 13.

The control circuit 13 is a circuit configured to collectively control the entire operation of the storage device 10. The control circuit 13 performs, for example, voltage pulse application to each memory cell MC by controlling operation of the word line driver 11 and the bit line driver 12 as described above. At data writing to the memory cell array MCA, the control circuit 13 changes the electric resistance of the phase change layer 40 of each writing target memory cell MC to a value corresponding to writing data by applying a voltage pulse in accordance with the writing data to the memory cell MC. At data reading from the memory cell array MCA, the control circuit 13 applies voltage to each reading target memory cell MC and reads data corresponding to the electric resistance value of the phase change layer 40 based on current flowing through the memory cell MC.

FIG. 2 schematically illustrates the configuration of the memory cell array MCA. Note that FIG. 2 only illustrates the word lines 20, the bit lines 30, the memory cells MC, and a semiconductor substrate BP (to be described later) in the memory cell array MCA, and omits illustration of insulating layers 81 and 82 (refer to FIG. 4) formed in the vicinity of the memory cells MC and the like.

In FIG. 2, an x axis is set in a direction in which the word lines 20 extend. In addition, a y axis is set in a direction in which the bit lines 30 extend, and a z axis is set in the up-down direction. The x axis, the y axis, and the z axis are orthogonal to each other. Hereinafter, a direction along the x axis will be also referred to as an "x direction". Similarly, a direction along the y axis will be also referred to as a "y direction". A direction along the z axis will be also referred to as a "z direction" below. Hereinafter, when another drawing is referred to, the configuration of each component may be described by using the x axis, the y axis, the z axis, the x direction, the y direction, and the z direction as described above.

As illustrated in FIG. 2, the memory cell array MCA is formed on the upper side of the semiconductor substrate BP. The semiconductor substrate BP is, for example, a silicon substrate.

Each word line 20 extends in the x direction as described above, and the plurality of word lines 20 are arranged in the y direction. Each bit line 30 extends in the y direction as described above, and the plurality of bit lines 30 are arranged in the x direction.

In the present embodiment, the plurality of bit lines 30 are disposed in each of the parts on the lower and upper sides of the word lines 20. Thus, the memory cells MC each provided at a part where a word line 20 and a bit line 30 intersect when viewed from the top are provided between each word line 20 and the corresponding bit line 30 on its lower side and between each word line 20 and the corresponding bit line 30 on its upper side. Each bit line 30 disposed on the lower side of a word line 20 will be also referred to as a "bit line 31" in the following description. Each bit line 30 disposed on the upper side of a word line 20 will be also referred to as a "bit line 32" in the following description.

Figure 3:
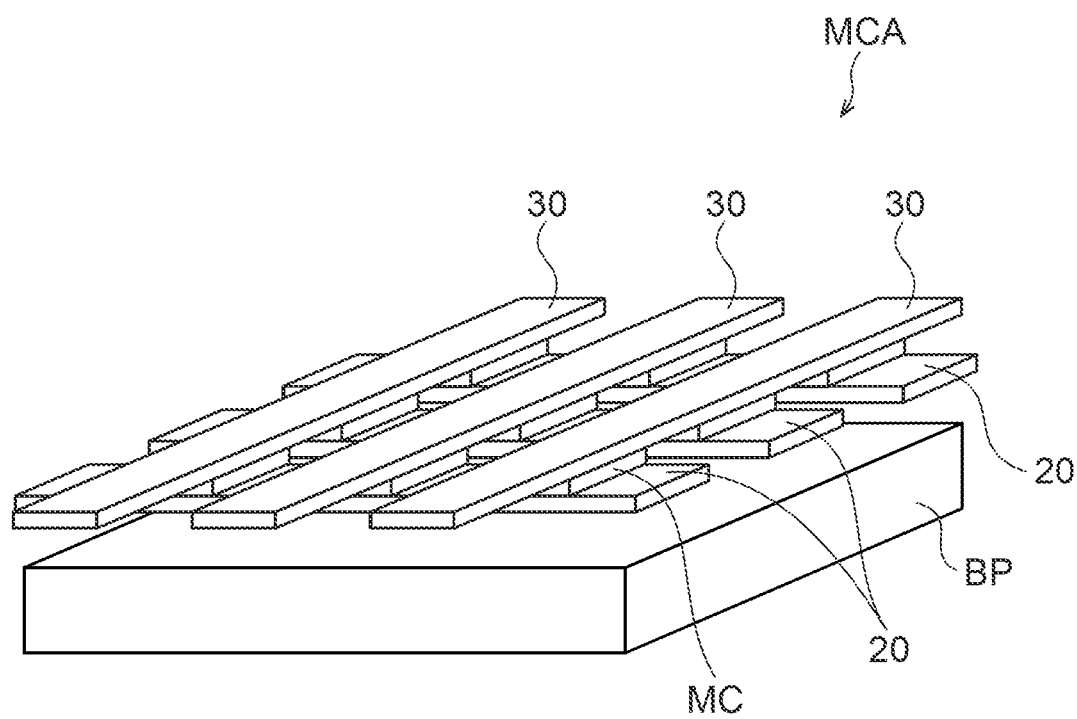
FIG. 3 is a diagram illustrating another exemplary configuration of the memory cell array in FIG. 1.

Instead of the aspect in FIG. 2, the plurality of bit lines 30 may be disposed only on the upper side of the word lines 20 as illustrated in FIG. 3. In this case, the memory cells MC are provided only between each word line 20 and the corresponding bit line 30 on its upper side.

Figure 4:
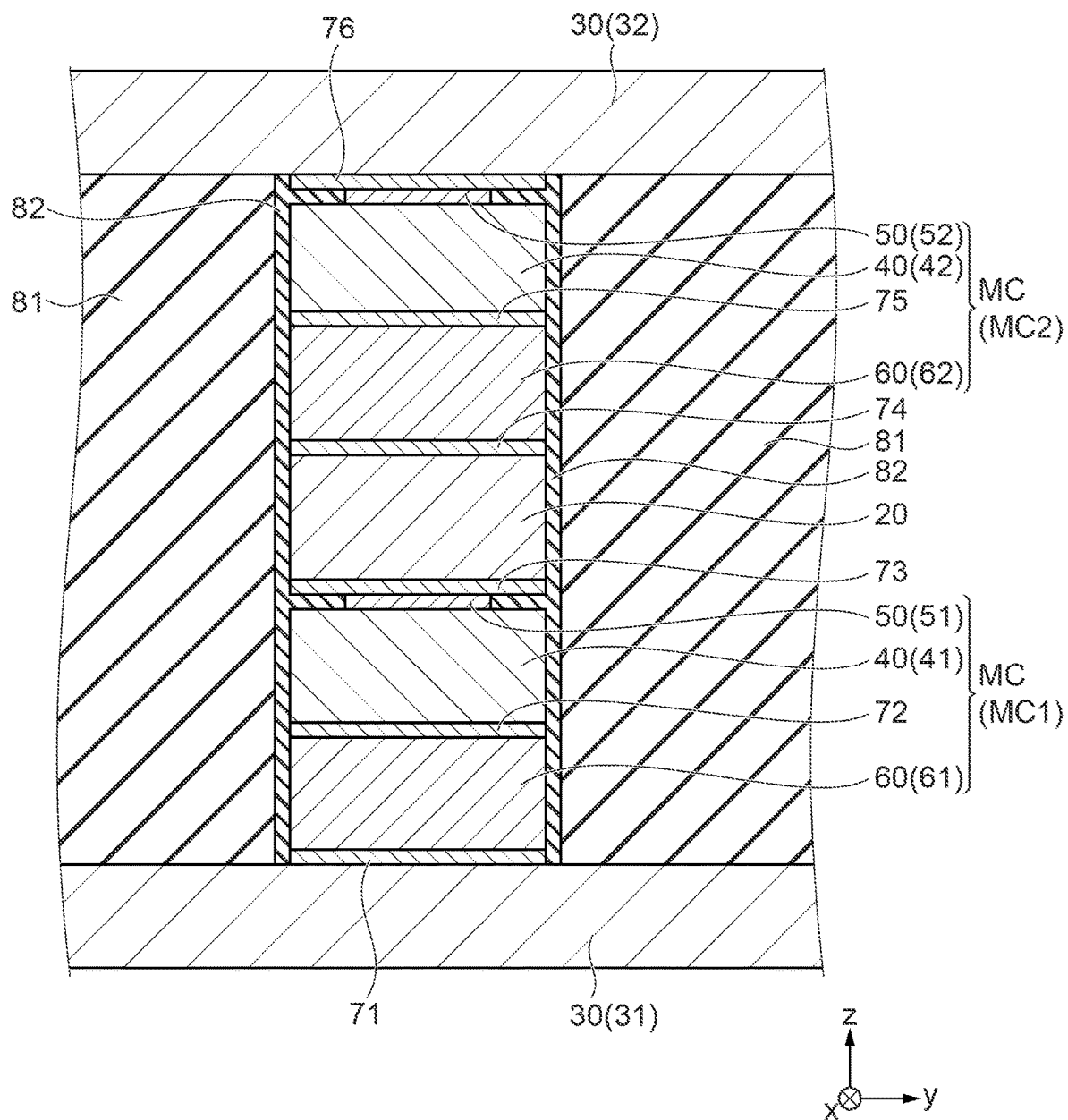
FIG. 4 is a cross-sectional view illustrating the configuration of a memory cell and its vicinity in the storage device according to the first embodiment.

A further specific configuration of each memory cell MC will be described below with reference to FIG. 4. FIG. 4 illustrates a section of a part corresponding to each cell memory MC and its vicinity, which is taken along a surface orthogonal to the x axis. FIG. 4 illustrates a section of a pair of memory cells MC disposed on the upper and lower sides of a word line 20. In the example illustrated in FIG. 4, the selector 60 and the phase change layer 40 in each memory cell MC are disposed side by side in the stated order in the z direction. However, the disposition order of the selector 60 and the phase change layer 40 in each memory cell MC may be opposite. Moreover, the disposition order of the selector 60 and the phase change layer 40 in each memory cell MC on the upper side may be opposite to the disposition order of the selector 60 and the phase change layer 40 in each memory cell MC on the lower side.

Each memory cell MC disposed on the lower side of a word line 20 will be also referred to as a "memory cell MC1" in the following description. Each memory cell MC disposed on the upper side of a word line 20 will be also referred to as a "memory cell MC2" in the following description. The phase change layer 40 and the selector 60 included in each memory cell MC1 on the lower side will be also referred to as a "phase change layer 41" and a "selector 61", respectively, in the following description. Similarly, the phase change layer 40 and the selector 60 included in each memory cell MC2 on the upper side will be also referred to as a "phase change layer 42" and a "selector 62", respectively, in the following description.

Each memory cell MC further includes the diffusion layer 50 adjacent to the phase change layer 40 in the z direction. The phase change layer 40 corresponds to a "resistance change layer" in the present embodiment, and the diffusion layer 50 corresponds to an "adjacent layer" in the present embodiment.

The diffusion layer 50 is formed of germanium (Ge) at high concentration. Note that the "high concentration" may be, for example, 100%, but the atomic concentration of germanium in the diffusion layer 50 only needs to be higher than at least the atomic concentration of germanium in the phase change layer 40. Germanium in the diffusion layer 50 functions as a "diffusive material" that diffuses inside the phase change layer 40. A diffusive material contained in the diffusion layer 50 does not necessarily need to be germanium but may be at least one of silicon (Si), carbon (C), tin (Sn), aluminum (Al), gallium (Ga), and indium (In). The diffusion layer 50 included in each memory cell MC1 on the lower side will be also referred to as a "diffusion layer 51" in the following description. Similarly, the diffusion layer 50 included in each memory cell MC2 on the upper side will be also referred to as a "diffusion layer 52" in the following description.

The configuration of each memory cell MC1 will be described below. As illustrated in FIG. 4, each memory cell MC1 includes the selector 61, a conductive layer 72, the phase change layer 41, and the diffusion layer 51 in a configuration in which these components are stacked in the z direction sequentially from the lower side. In the example illustrated in FIG. 4, in each memory cell MC1, the phase change layer 41 and the diffusion layer 51 are disposed side by side in the stated order in the z direction. However, the disposition order of the phase change layer 41 and the diffusion layer 51 in each memory cell MC1 may be opposite. Moreover, the disposition order of the phase change layer 42 and the diffusion layer 52 in each memory cell MC2 on the upper side may be opposite to the disposition order of the phase change layer 41 and the diffusion layer 51 in each memory cell MC1 on the lower side.

The selector 61 is connected to the corresponding bit line 31 on its lower side through a conductive layer 71. The conductive layer 71 may be made of a metallic material such as tungsten. The selector 61 is formed of, for example, a material containing chalcogen elements.

The conductive layer 72 is a layer made of a metallic material the same as that of the conductive layer 71 and formed between the selector 61 and the phase change layer 41.

Figure 5:
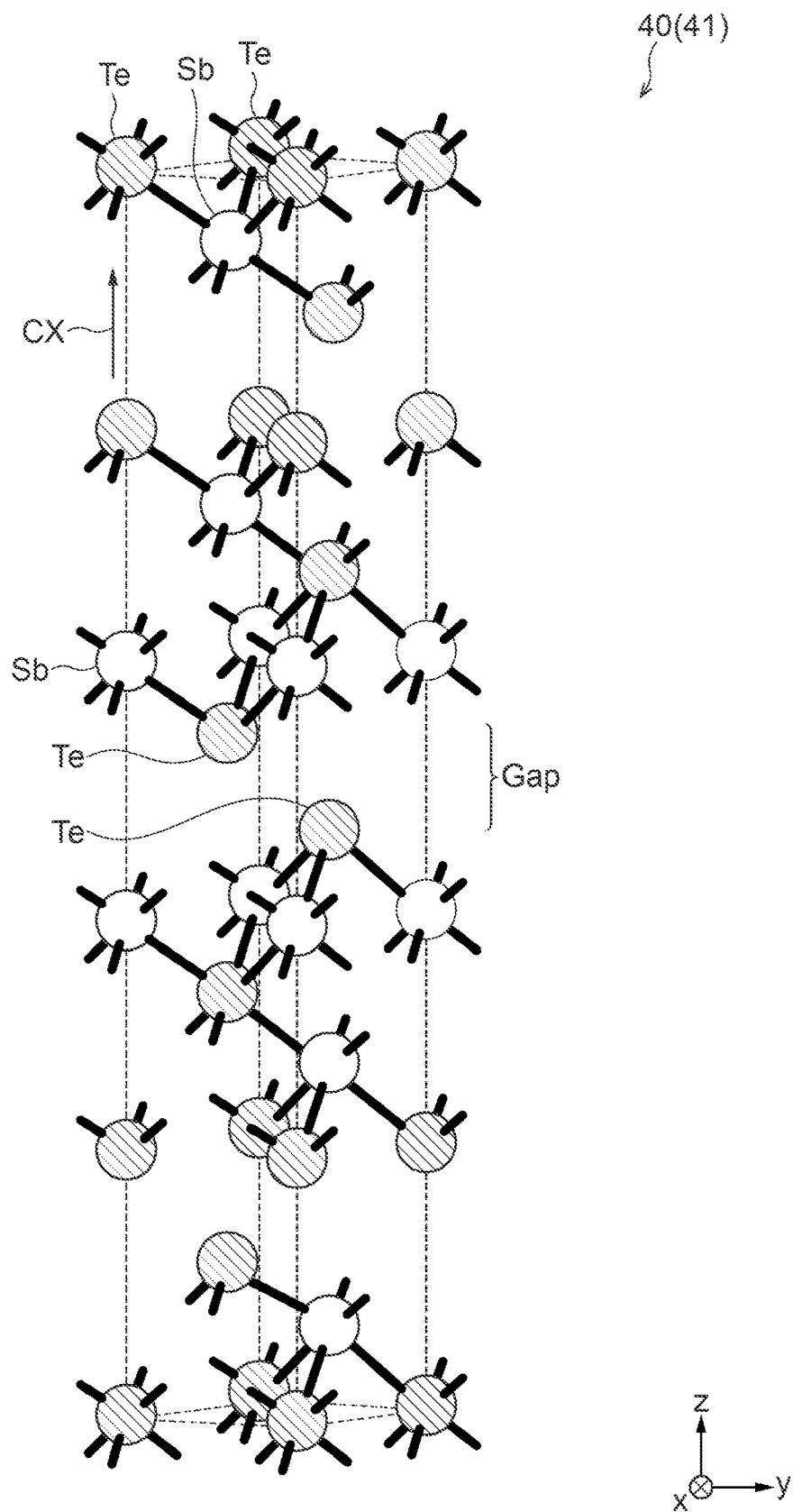
FIG. 5 is a diagram illustrating the crystal structure of an adjacent layer.

The phase change layer 41 is a layer formed of antimony telluride ($Sb_2Te_3$) as described above. FIG. 5 schematically illustrates the crystal structure of $Sb_2Te_3$ contained in the phase change layer 41. As illustrated in FIG. 5, the phase change layer 41 has a hexagonal crystal structure. Note that the arrow "CX" in FIG. 5 illustrates the direction of the C axis in the crystal structure of $Sb_2Te_3$. The direction is aligned with the z direction. In this manner, $Sb_2Te_3$ of the phase change layer 41 has a crystal structure having a C axis oriented in the z direction (in other words, the direction in which the phase change layer 41 and the diffusion layer 51 are stacked). Note that the "crystal structure having a C axis oriented in the z direction" includes not only a case in which the direction of the C axis of $Sb_2Te_3$ is completely aligned with the z direction but also a case in which the direction of the C axis of $Sb_2Te_3$ is tilted by several degrees with reference to the z direction.

In a crystal of $Sb_2Te_3$ as in FIG. 5, a part in which the interval between Te atoms included in the crystal is longer in the direction of the C axis (the z direction), in other words, a Te—Te gap as a part denoted by the text "Gap" in FIG. 5 is formed along the x-y plane. A plurality of such Te—Te gaps are further arranged in the direction of the C axis (the z direction).

Description continues with reference to FIG. 4. The diffusion layer 51 is disposed at a position between the corresponding word line 20 and the phase change layer 41 and adjacent to the phase change layer 41. The diffusion layer 51 is a layer containing a high-concentration diffusive material as described above, and germanium (Ge) is used as the diffusive material in the present embodiment. The diffusion layer 51 is formed to directly cover the upper surface of the phase change layer 41. However, the length of the diffusion layer 51 in the y direction is shorter than the length of the phase change layer 41 in the y direction. Thus, a sectional shape of the diffusion layer 51 when viewed in the z direction is smaller than a sectional shape of the phase change layer 41 when viewed in the z direction. Instead of or in addition to such a configuration, the length of the diffusion layer 51 in the x direction may be shorter than the length of the phase change layer 41 in the x direction. For example, when the sectional shapes are circular, the radius of the diffusion layer 51 may be shorter than the radius of the phase change layer 41.

The diffusion layer 51 is connected to the word line 20 on its upper side through a conductive layer 73. The conductive layer 73 is a layer made of a metallic material the same as that of the conductive layers 71 and 72.

The configuration of each memory cell MC2 is identical to the configuration of each memory cell MC1 described above. Specifically, the materials and structures of the selector 62, the phase change layer 42, and the diffusion layer 52 included in each memory cell MC2 are identical to the materials and structures of the selector 61, the phase change layer 41, and the diffusion layer 51, respectively, included in each memory cell MC1. However, as described above, the disposition order of the selector 62, the phase change layer 42, and the diffusion layer 52 in each memory cell MC2 may be different from the disposition order of the selector 61, the phase change layer 41, and the diffusion layer 51 in each memory cell MC1.

A conductive layer 74 made of a metallic material the same as that of the conductive layer 71 is provided between the word line 20 and the selector 62. A conductive layer 75 made of a metallic material the same as that of the conductive layer 72 is provided between the selector 62 and the phase change layer 42. A conductive layer 76 made of a metallic material the same as that of the conductive layer 73 is provided between the diffusion layer 52 and the bit line 32.

As illustrated in FIG. 4, the insulating layer 81 is formed in the vicinity of each memory cell MC. The insulating layer 81 is a layer formed of an insulation material such as oxide silicon ($SiO_2$). Memory cells MC at different positions in the x direction or the y direction are separated and electrically insulated from each other through the insulating layer 81. In addition, since the insulating layer 81 is formed of a material having a relatively small thermal conductivity, memory cells MC at different positions are thermally insulated from each other as well. This prevents a situation in which Joule heat generated due to writing operation to some memory cells MC is conveyed to the other memory cells MC and causes false writing (or false erasure).

The side surfaces of each memory cell MC and each word line 20 are covered by the insulating layer 82. Thus, each memory cell MC does not contact the insulating layer 81 and is covered by the insulating layer 81 through the insulating layer 82. The insulating layer 82 is a layer formed of an insulation material not containing oxygen, such as silicon nitride (SiN). The insulating layer 82 prevents oxidation of a material such as germanium contained in the diffusion layer 50.

Figure 6A:
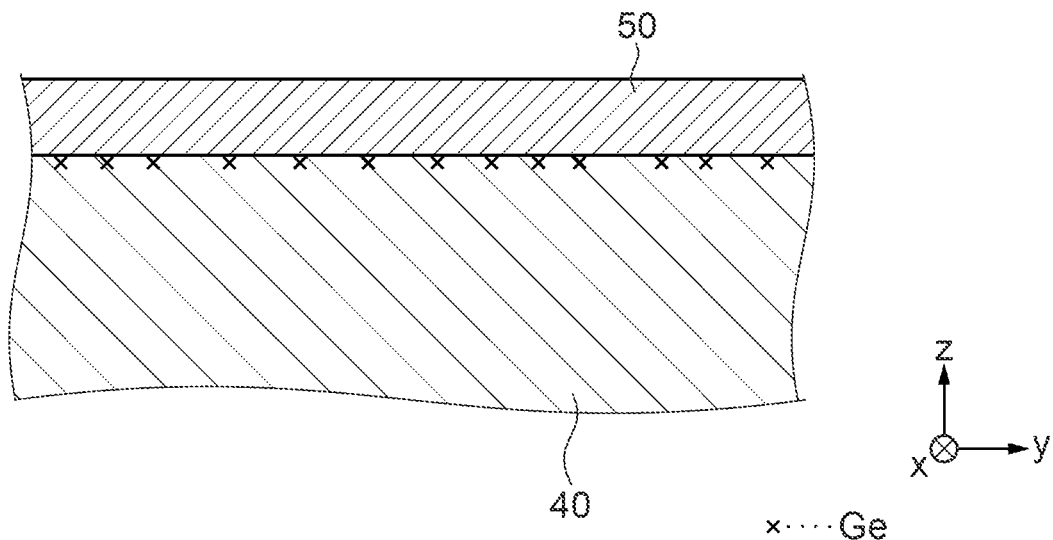
FIGS. 6A and 6B are each a diagram schematically illustrating distribution of germanium in a resistance change layer.
Figure 6B:
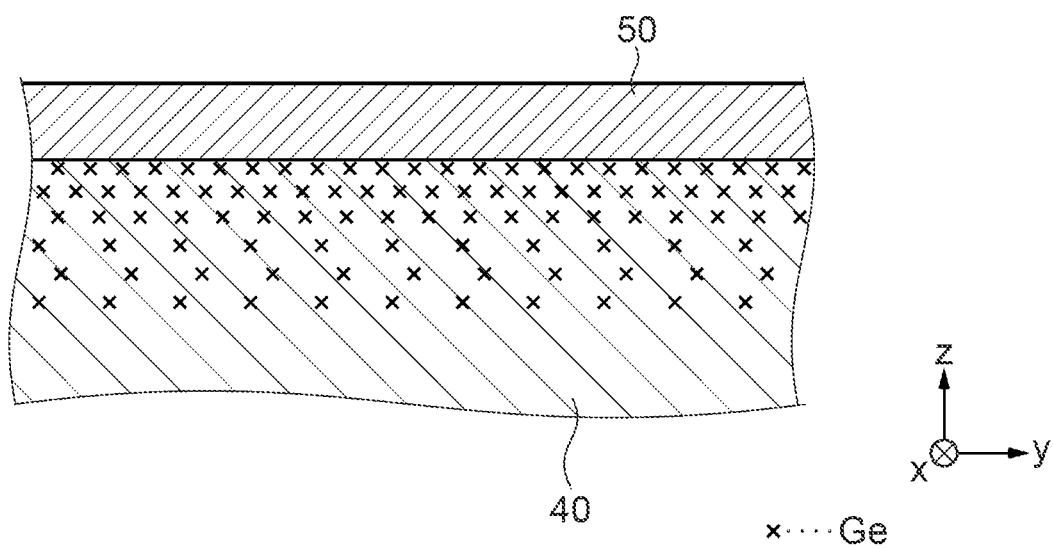
Figure 7A:
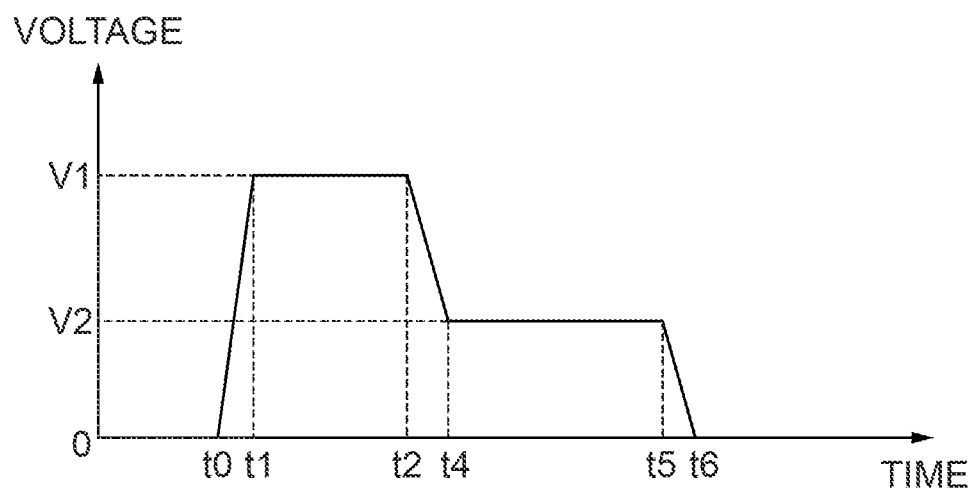
FIGS. 7A and 7B are each a diagram illustrating a voltage pulse applied to the resistance change layer and the adjacent layer.
Figure 7B:
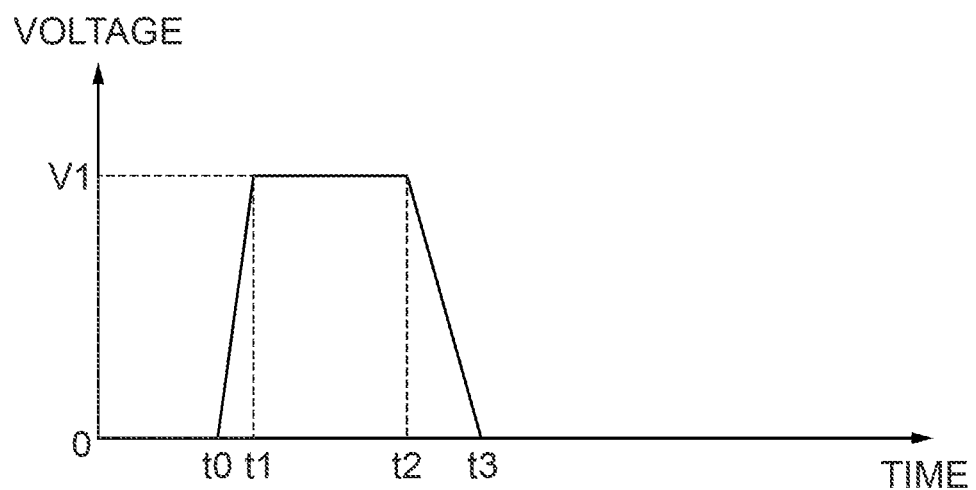

State change of the phase change layer 40 and the like in operation of the storage device 10 will be described below with reference to FIGS. 6A, 6B, 7A, and 7B. FIGS. 6A and 6B each schematically illustrate exemplary distribution of Ge inside the phase change layer 40. FIGS. 7A and 7B each illustrate an exemplary waveform of a voltage pulse applied between the bit line 30 and the word line 20.

As described above, the phase change layer 40 (resistance change layer) can reversibly transition between the first state and the second state different from each other in the electric resistance. Such state transition occurs in accordance with distribution of a diffusive material (Ge) having diffused from the diffusion layer 50 to the phase change layer 40.

FIG. 6A illustrates exemplary distribution of Ge in the phase change layer 40 in the first state. As illustrated in FIG. 6A, the amount of Ge distributed inside the phase change layer 40 is extremely small in the first state. However, a small amount of Ge having diffused from the diffusion layer 50 is distributed in a narrow range extending from a part contacting the diffusion layer 50 to the negative side in the z direction in the phase change layer 40. In the first state, the electric resistance is relatively large on a path along which current flows through the phase change layer 40 and the like in the z direction.

When the phase change layer 40 is to be caused to transition from the first state in FIG. 6A to the second state in FIG. 6B, a voltage pulse as illustrated in FIG. 7A is applied to the bit line 30 and the word line 20 between which the phase change layer 40 is sandwiched. The voltage pulse is applied so that potential on the phase change layer 40 side becomes higher than potential on the diffusion layer 50 side. Thus, for example, when the phase change layer 41 on the lower side is to be caused to transition to the second state, the voltage pulse in FIG. 7A is applied between the bit line 31 and the word line 20 in a direction with which the potential of the bit line 31 becomes higher than the potential of the word line 20. When the phase change layer 42 on the upper side is to be caused to transition to the second state, the voltage pulse in FIG. 7A is applied between the bit line 32 and the word line 20 in a direction with which the potential of the word line 20 becomes higher than the potential of the bit line 32.

In the example of FIG. 7A, voltage between the bit line 30 and the word line 20 increases from zero to V1 in the duration from time t0 to time t1. Thereafter, the voltage is maintained at V1 until time t2, and then decreases to V2 in the duration from time t2 to time t4. V2 is voltage lower than V1 and higher than a threshold value for setting the selector 60 to be on. The voltage between the bit line 30 and the word line 20 is maintained at V2 in the duration from time t4 to time t5 and then returned to zero in the duration from time t5 to time t6.

In the duration in which voltage is applied between the bit line 30 and the word line 20, the temperatures of the phase change layer 40 and the diffusion layer 50 increase due to Joule heat. In this case, Ge diffusion is promoted in a direction (the negative z direction) from the diffusion layer 50 to the inside of the phase change layer 40 due to Ge concentration difference between the phase change layer 40 and the diffusion layer 50. Ge diffusion that occurs in this principle will be also referred to as "first diffusion" in the following description.

Ge atoms having diffused inside the diffusion layer 50 are in a positively charged state. Thus, when a voltage pulse is applied so that potential on the phase change layer 40 side becomes higher than potential on the diffusion layer 50 side, the Ge atoms receive force from an electric field in a direction (the z direction) from the inside of the phase change layer 40 toward the diffusion layer 50. This force promotes Ge diffusion in the z direction. Ge diffusion that occurs in this principle will be also referred to as "second diffusion" in the following description.

As described above, the first diffusion and the second diffusion in directions opposite to each other can occur as Ge diffusion in a duration in which a voltage pulse is applied between the bit line 30 and the word line 20. The first diffusion mainly occurs in a duration in which the voltage between the bit line 30 and the word line 20 decreases. The second diffusion mainly occurs in a duration in which the above-described voltage is maintained at V1. Thus, the first diffusion in the direction from the diffusion layer 50 toward the inside of the phase change layer 40 is dominant when the voltage is slowly decreased at stages in cooling as in the example of FIG. 7A. Thus, at a part near the interface contacting the diffusion layer 50 in the phase change layer 40, Ge moves toward the inside of the phase change layer 40, thereby achieving a state in which Ge is distributed to a deeper part in the negative z direction than in FIG. 6A, in other words, the second state illustrated in FIG. 6B.

As described above with reference to FIG. 5, the phase change layer 40 of the present embodiment has a crystal structure having a C axis oriented in the z direction, and thus a plurality of Te—Te gaps are arranged in the z direction. Ge having diffused from the diffusion layer 50 enters each Te—Te gap and decreases the bandgap at this part. As a result, the electric resistance of the phase change layer 40 decreases at the part.

In this manner, in the second state in FIG. 6B, the electric resistance near the interface contacting the diffusion layer 50 in the phase change layer 40 is smaller than the electric resistance in the first state in FIG. 6A. The second state is stably maintained after the voltage pulse application is ended, as well.

Note that, when the voltage pulse is applied, the temperatures of the phase change layer 40 and the diffusion layer 50 increase by Joule heat. However, for example, the peak value of the voltage pulse and the like are adjusted in advance so that each temperature does not increase to a temperature beyond which the layer melts. Thus, the phase change layer 40 remains in a crystal state and does not become a non-crystal state in the process of transition from the first state to the second state.

In order to transition the phase change layer 40 from the second state in FIG. 6B to the first state in FIG. 6A, a voltage pulse as illustrated in FIG. 7B is applied to the bit line 30 and the word line 20 between which the phase change layer 40 is sandwiched. Similarly to the case of FIG. 7A, the voltage pulse is applied so that potential on the phase change layer 40 side becomes higher than potential on the diffusion layer 50 side. Thus, for example, when the phase change layer 41 on the lower side is to be caused to transition to the first state, the voltage pulse in FIG. 7B is applied between the bit line 31 and the word line 20 in a direction in which the potential of the bit line 31 becomes higher than the potential of the word line 20. When the phase change layer 42 on the upper side is to be caused to transition to the second state, the voltage pulse in FIG. 7B is applied between the bit line 32 and the word line 20 in a direction in which the potential of the word line 20 becomes higher than the potential of the bit line 32.

In the example of FIG. 7B as well, the voltage between the bit line 30 and the word line 20 increases from zero to V1 in the duration from time t0 to time t1. Thereafter, the voltage is maintained at V1 until time t2. Then, the voltage is returned to zero in the duration from time t2 to time t3.

Note that the peak value of a voltage pulse for transition from the second state to the first state may be different from the peak value (V1) of a voltage pulse for transition from the first state to the second state. In addition, a duration in which the voltage pulse for transition from the second state to the first state is maintained at its peak value may be different from a duration (duration from time t1 to time t2) in which the voltage pulse for transition from the first state to the second state is maintained at its peak value.

In transition from the second state to the first state, the voltage does not decrease at stages from time t2 but decreases at a substantially constant speed from the voltage V1 to zero. The duration from time t2 to time t3 is shorter than the duration from time t2 to time t6.

In the example of FIG. 7B, when the voltage is returned to zero in a relatively short time at cooling, the first diffusion in the direction from the diffusion layer 50 toward the inside of the phase change layer 40 is unlikely to occur as compared to the example of FIG. 7A. Thus, in the example of FIG. 7B, the second diffusion in the direction from the inside of the phase change layer 40 toward the diffusion layer 50, which occurs in the duration until time t2, is dominant. Thus, in the part of the phase change layer 40 near the interface contacting the diffusion layer 50, Ge that has entered the Te—Te gap of the phase change layer 40 moves toward the diffusion layer 50 side. As a result, the phase change layer 40 returns to the first state illustrated in FIG. 6A. In this case, since Ge moves from a Te—Te gap in the phase change layer 40, the bandgap at this part increases. As a result, the electric resistance of the phase change layer 40 increases at the part.

In this manner, in the first state in FIG. 6A, the electric resistance near the interface contacting the diffusion layer 50 in the phase change layer 40 is smaller than the electric resistance in the second state in FIG. 6B. The first state is stably maintained after the voltage pulse application is ended, as well.

In the process of transition from the second state to the first state, as well, the temperatures of the phase change layer 40 and the diffusion layer 50 increase, but the peak value of the voltage pulse and the like are adjusted in advance so that each temperature does not increase to a temperature beyond which the layer melts. Thus, the phase change layer 40 remains in the crystal state and does not become the non-crystal state in the process of transition from the second state to the first state, as well.

As described above, the phase change layer 40 is in the crystal state in any of the first state and the second state. Moreover, the phase change layer 40 is maintained in the crystal state and does not become the non-crystal state in any of the process of transition from the first state to the second state and the process of transition from the second state to the first state. Compared to a storage device configured so that the state of the phase change layer transitions between the crystal state and the non-crystal state, the phase change layer 40 does not need to be melted in the present embodiment, and thus current necessary for, for example, writing operation of the storage device 10 is reduced. Accordingly, the storage device 10 can be operated with current smaller than that in conventional cases.

In the present embodiment, the length of the diffusion layer 50 in the y direction is shorter than the length of the phase change layer 40 in the y direction. Since a path along which current flows at voltage pulse application is narrowed in the diffusion layer 50, current necessary for, for example, writing operation of the storage device 10 is further reduced. Moreover, since current passes through a local path in the phase change layer 40, state transition in the phase change layer 40 is more efficiently performed.

Among a word line 20 and a bit line 30 between which a memory cell MC is sandwiched, a line disposed on a side opposite to the diffusion layer 50 (adjacent layer) in the z direction when viewed from the phase change layer 40 (resistance change layer) of the memory cell MC corresponds to a "first wiring layer" in the present embodiment. In addition, a line disposed on a side opposite to the phase change layer 40 (resistance change layer) in the z direction when viewed from the diffusion layer 50 (adjacent layer) of the memory cell MC corresponds to a "second wiring layer" in the present embodiment.

For example, in each memory cell MC1 on the lower side, the bit line 31 corresponds to the first wiring layer, and the word line 20 corresponds to the second wiring layer. In each memory cell MC2 on the upper side, the word line 20 corresponds to the first wiring layer, and the bit line 32 corresponds to the second wiring layer. In any case, the first wiring layer and the second wiring layer are disposed at positions separated from each other in the z direction, and the phase change layer 40 and the diffusion layer 50 are disposed between the wiring layers. When the phase change layer 40 is to be caused to transition between the first state and the second state, a voltage pulse with which the potential of the first wiring layer becomes higher than the potential of the second wiring layer is applied to the phase change layer 40 and the diffusion layer 50.

To achieve the above-described effect, specifically, the effect of operating the storage device 10 with current smaller than that in conventional cases, the thickness of the phase change layer 40 in the z direction is preferably equal to or larger than 5 nm, and the thickness of the diffusion layer 50 in the z direction is preferably equal to or smaller than 5 nm.

A method of manufacturing the storage device 10 according to the present embodiment will be described below.

Stacking Process

First in a stacking process, an insulating film is formed on the upper side of the semiconductor substrate BP, and then a plurality of bit lines 31 are formed on the insulating film. The bit lines 31 can be formed by, for example, depositing a metal film through CVD and then applying etching using photolithography to the metal film. After the etching is performed, an insulating film is formed through, for example, CVD to cover the bit lines 31 and their vicinity, and flattening processing through CMP is performed on the insulating film. Accordingly, the upper surfaces of the bit lines 31 are exposed.

Figure 8:
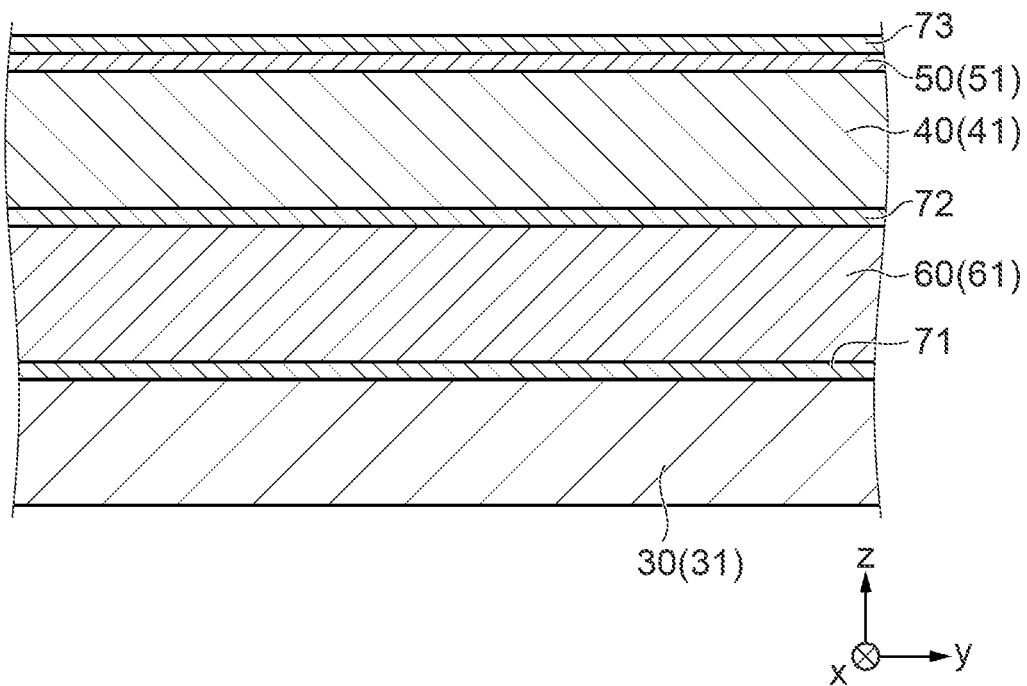
FIG. 8 is a diagram for explaining a method of manufacturing the storage device according to the first embodiment.

Thereafter, a conductive layer 71, a selector 61, a conductive layer 72, a phase change layer 41, a diffusion layer 51, and a conductive layer 73 are sequentially formed from below through, for example, CVD to cover the upper side of each bit line 31. FIG. 8 illustrates a partial section after the stacking process as described above is completed.

Patterning Process

Figure 9:
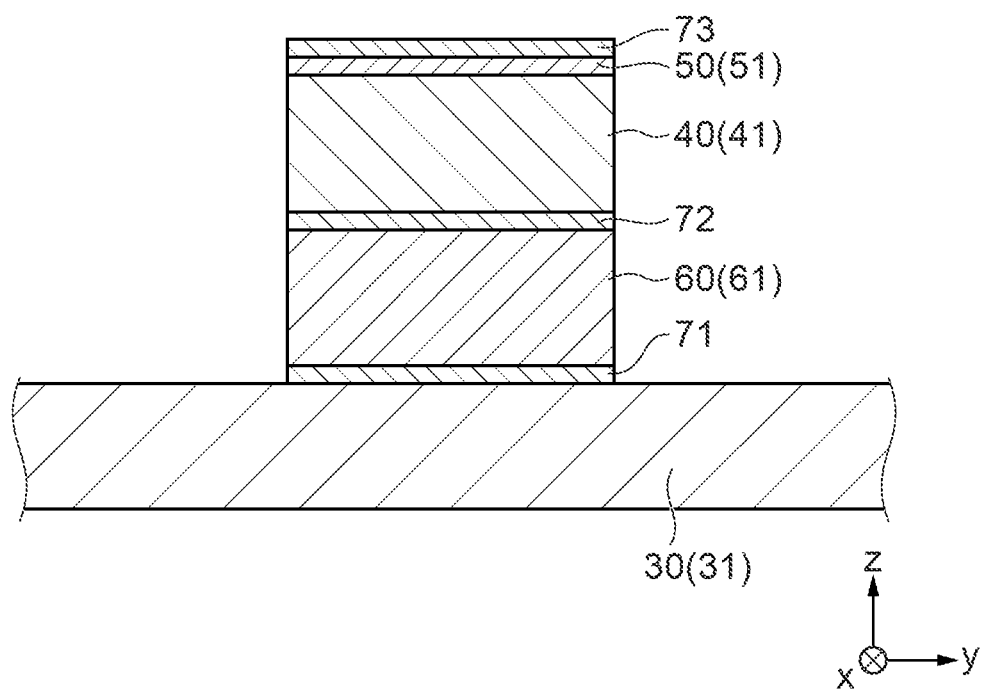
FIG. 9 is a diagram for explaining the method of manufacturing the storage device according to the first embodiment.

In a patterning process following the stacking process, films stacked on the upper side of the bit lines 31 are partially removed by etching using, for example, photolithography. Specifically, only parts to be memory cells MC1 among the stacked films are left intact, and the other part is removed. FIG. 9 illustrates a partial section after the patterning process is completed.

Recess Formation Process

Figure 10:
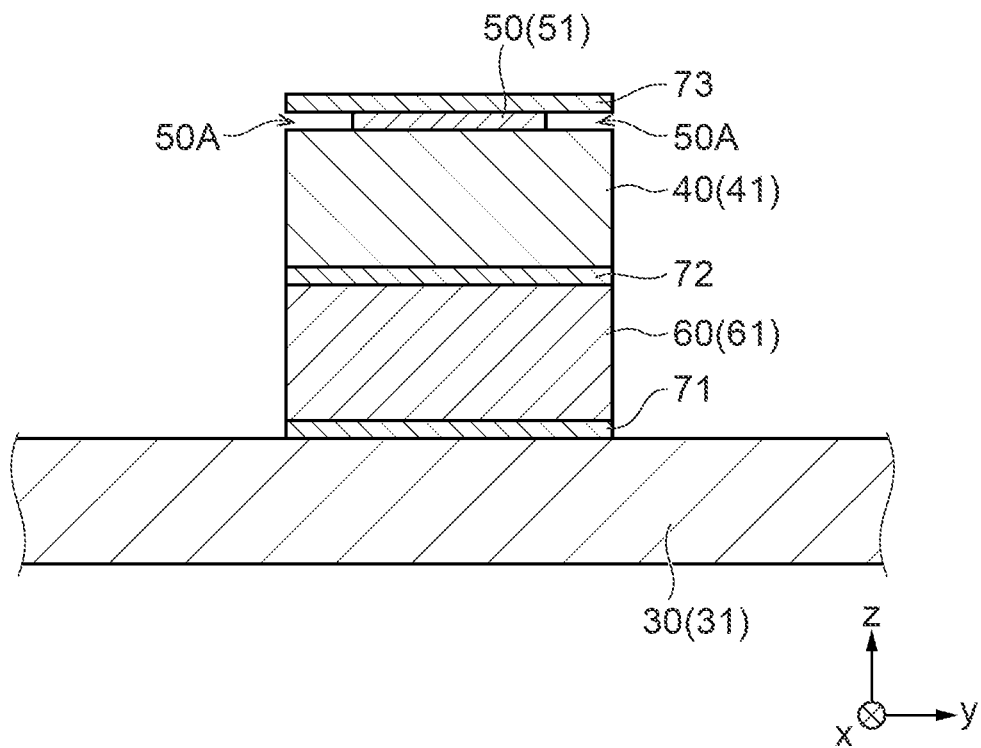
FIG. 10 is a diagram for explaining the method of manufacturing the storage device according to the first embodiment.

In a recess formation process following the patterning process, side surface parts of the stacked films left as described above are cleaned by, for example, wet etching. In this process, drug solution having selectiveness for the diffusion layer 51 is used. Part of the diffusion layer 51 is removed simultaneously with the cleaning, and as a result, the length of the diffusion layer 51 in the y direction becomes shorter than the length of the phase change layer 41 in the y direction. A recess 50A retracted toward the diffusion layer 51 is formed between the phase change layer 41 and the conductive layer 73. FIG. 10 illustrates a partial section after the recess formation process is completed.

Insulating Layer Formation Process

Figure 11:
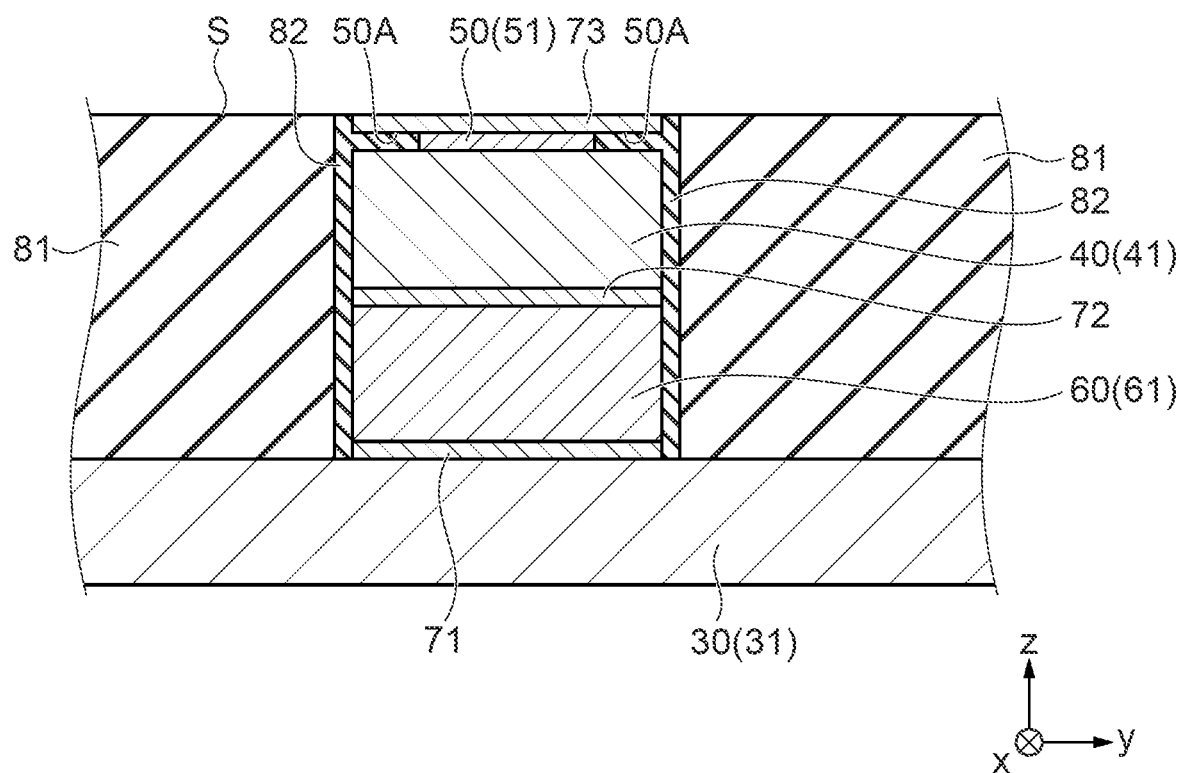
FIG. 11 is a diagram for explaining the method of manufacturing the storage device according to the first embodiment.

In an insulating layer formation process following the recess formation process, an insulating layer 82 and an insulating layer 81 are formed in the stated order through CVD to fill the vicinity of the plurality of memory cells MC1 formed in the patterning process. The insulating layer 82, which is formed first, enters inside the recess 50A. In the present embodiment, the recess 50A is entirely filled by the insulating layer 82. After the insulating layers 81 and 82 are formed, CMP (chemical mechanical polishing) is provided on the entire upper surfaces of the insulating layers 81 and 82 and the like so that the conductive layer 73 is exposed along a flat surface S. FIG. 11 illustrates a partial section after the insulating layer formation process is completed.

After the memory cells MC1 and their vicinity are formed as described above, word lines 20 are formed along the surface S by a method the same as the method of forming the bit lines 31. Subsequently, the stacking process, the patterning process, the recess formation process, and the insulating layer formation process described above are performed again to form memory cells MC2 at positions directly above the memory cells MC1 with the word lines 20 interposed therebetween. Thereafter, bit lines 32 are formed on the upper side of the memory cells MC2 by a method the same as the method of forming the bit lines 31. In this manner, the storage device 10 including memory cells MC as illustrated in FIG. 4 can be manufactured.

To manufacture a storage device including a phase change layer having a superlattice structure in which, for example, GeTe and $Sb_2Te_3$ are alternately stacked as in a conventional iPCM, it is necessary to alternately form a plurality of layers constituting a superlattice. However, to manufacture the storage device 10 according to the present embodiment, it is not necessary to perform a process of alternately stacking a plurality of layers as described above. Thus, the storage device 10 can be relatively easily manufactured as compared to a case in which the conventional iPCM is manufactured.

A second embodiment will be described below. The following description is mainly made on any feature different from the first embodiment, and description of any feature common to the first embodiment is omitted as appropriate.

Figure 12:
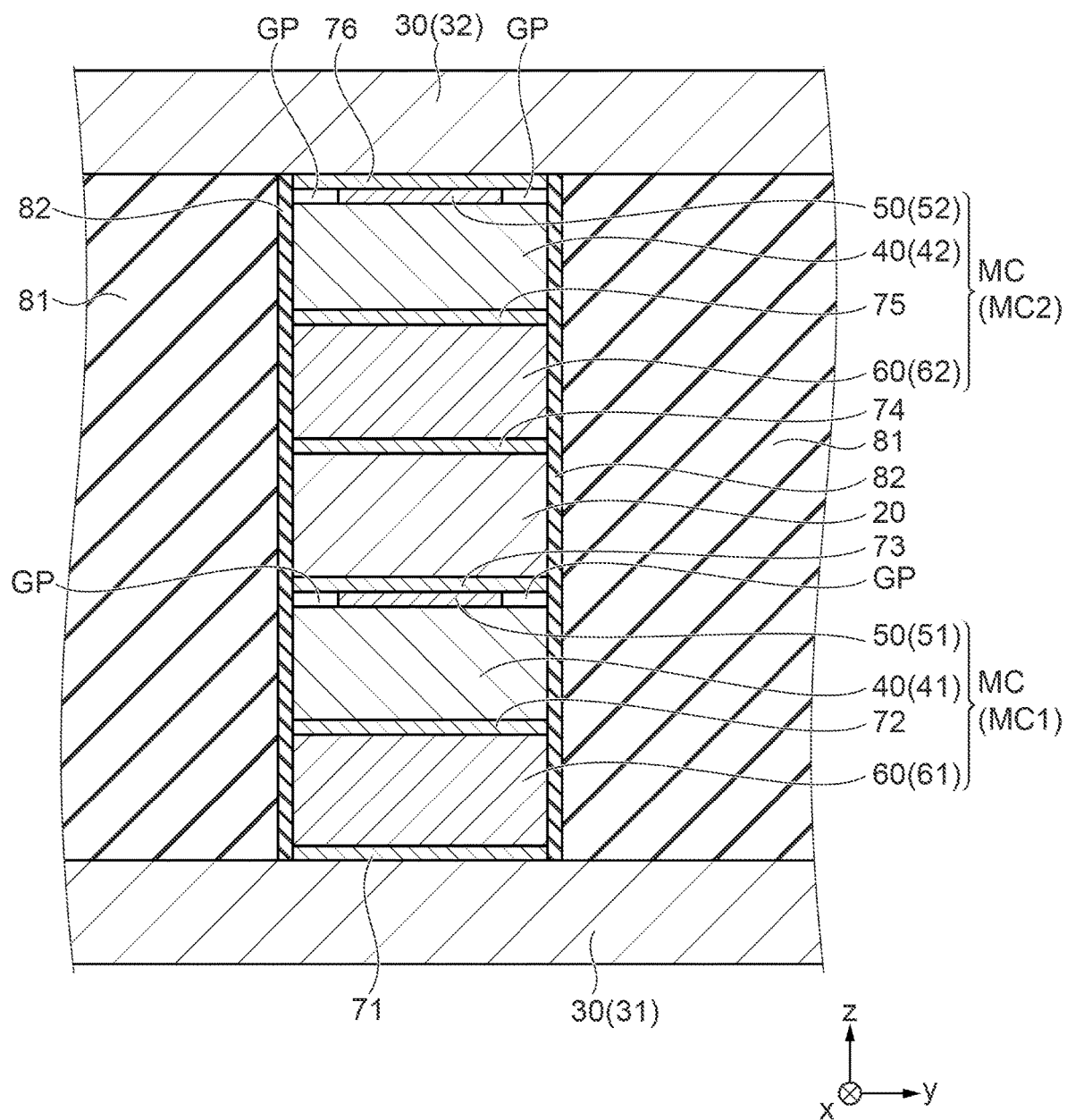
FIG. 12 is a diagram schematically illustrating the configuration of a storage device according to a second embodiment.

FIG. 12 illustrates, from the same viewpoint as that of FIG. 4, the configuration of a part corresponding to each memory cell MC and its vicinity in a storage device 10 according to the present embodiment. As illustrated in FIG. 12, void spaces GP are formed in the vicinity of the diffusion layer 50 in the present embodiment. Specifically, the "vicinity of the diffusion layer 50" means a position between the phase change layer 41 and the conductive layer 73 and adjacent to the diffusion layer 51, and a position between the phase change layer 42 and the conductive layer 76 and adjacent to the diffusion layer 52.

In the present embodiment, Joule heat generated when a voltage pulse is applied to the memory cell MC can be trapped by the void spaces GP. Thus, a temperature necessary for transition of the temperature of the phase change layer 40 between the first state and the second state can be reached with smaller current. Accordingly, the storage device 10 can be operated with current further smaller than that in conventional cases.

To manufacture the storage device 10 having such a configuration, it is sufficient to prevent the insulating layer 82 from entering inside the recess 50A in the insulating layer formation process. For example, the recess 50A may be formed in a shape with which the void spaces GP are likely to remain by reducing the thickness (dimension in the z direction) of the diffusion layer 51 in the stacking process or increasing a depth dimension (dimension in the y direction) of the recess 50A in the recess formation process. Alternatively, the void spaces GP may be formed by changing a deposition condition of the insulating layer 82 in the insulating layer formation process.

A third embodiment will be described below. The following description is mainly made on any feature different from the first embodiment, and description of any feature common to the first embodiment is omitted as appropriate.

Figure 13:
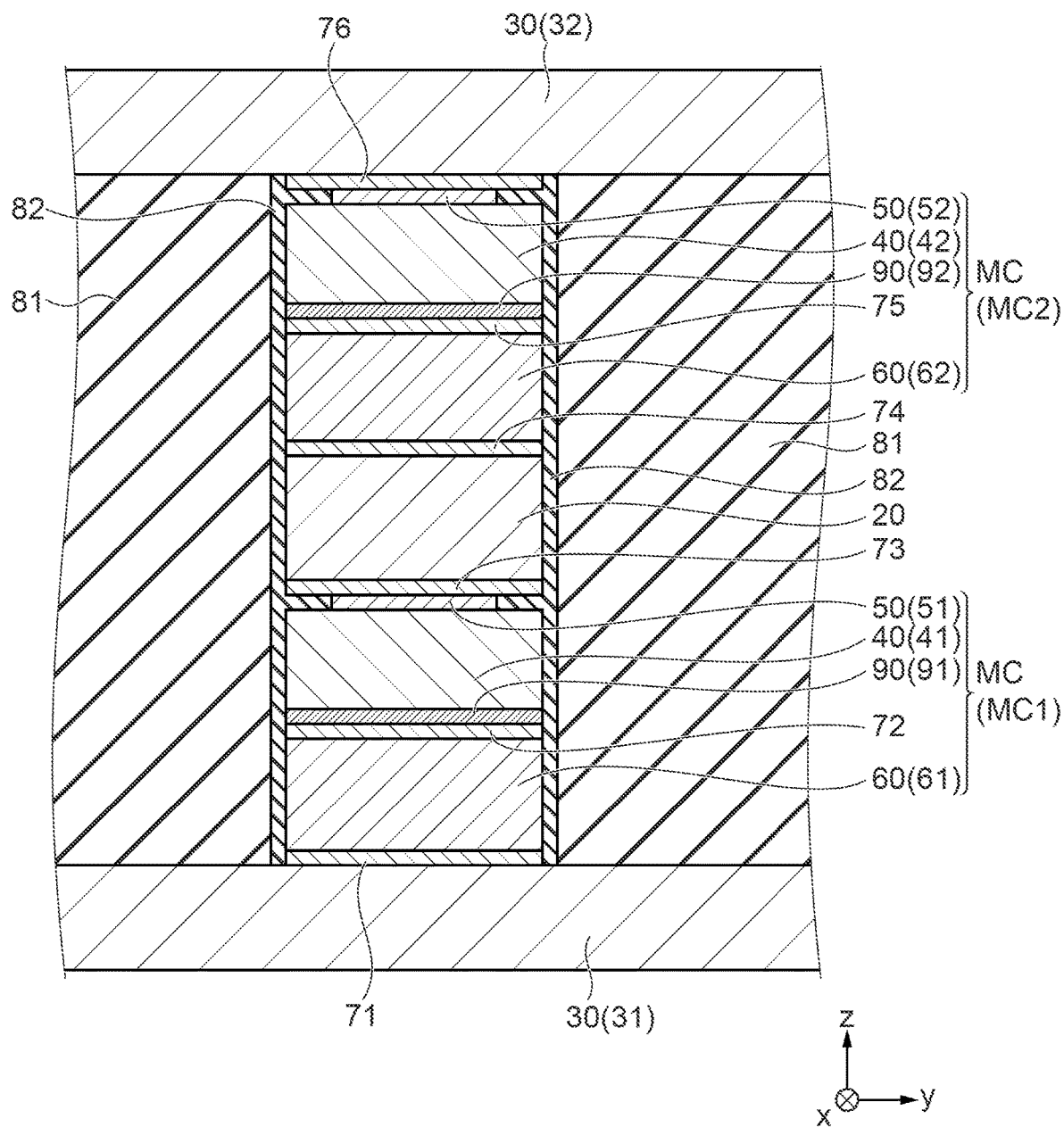
FIG. 13 is a diagram schematically illustrating the configuration of a storage device according to a third embodiment.

FIG. 13 illustrates, from the same viewpoint as that of FIG. 4, the configuration of a part corresponding to each memory cell MC and its vicinity in a storage device 10 according to the present embodiment. As illustrated in FIG. 13, a crystal layer 90 is formed at a position adjacent to the phase change layer 40 on the negative side in the z direction in the present embodiment. The crystal layer 90 included in each memory cell MC1 on the lower side will be also referred to as a "crystal layer 91" in the following description. Similarly, the crystal layer 90 included in each memory cell MC2 on the upper side will be also referred to as a "crystal layer 92" in the following description.

A position at which the crystal layer 91 is formed can be expressed as a position between the phase change layer 41 and the bit line 31. A position at which the crystal layer 92 is formed can be expressed as a position between the phase change layer 42 and the word line 20. Each position corresponds to a position between the resistance change layer and the first wiring layer in the memory cell MC.

The crystal layer 90 is formed of a titanium ditelluride ($TiTe_2$) crystal. $TiTe_2$ is a two-dimensional crystal, and the crystal layer 90 is formed so that the "a" axis and the "b" axis of the crystal are oriented in directions orthogonal to the z direction. The material of the crystal layer 90 is not limited to $TiTe_2$, and other transition metal compound may be used as the material of the crystal layer 90. As such a material, for example, a material such as hafnium ditelluride ($HfTe_2$) and zirconium ditelluride ($ZrTe_2$) can be used.

To manufacture the storage device 10 according to the present embodiment, the crystal layer 91 may be formed after the conductive layer 72 is formed in the stacking process, and the phase change layer 41 may be formed to cover the crystal layer 91. Similarly, the crystal layer 92 may be formed after the conductive layer 75 is formed, and the phase change layer 42 may be formed to cover the crystal layer 92.

In this case, the phase change layer 40 is formed on the upper surface of $TiTe_2$ formed as an orientation layer in advance, and thus a crystal structure having a C axis oriented in the z direction can be achieved more easily. Moreover, higher adhesion can be achieved between the phase change layer 40 and an electrode layer (the conductive layer 72 or the conductive layer 75) on the lower side of the phase change layer 40.

In the present invention, "high potential" means that the voltage is high in the positive direction unless otherwise defined.

The present embodiments are described above with reference to specific examples. However, the present disclosure is not limited to these specific examples. Modifications of these specific examples in designing by the skilled person in the art as appropriate are included in the scope of the present disclosure as long as characteristics of the present disclosure are maintained. Each element included in each specific example described above and, for example, the disposition, condition, and shape of the element are not limited to those exemplarily described but may be changed as appropriate. Combinations of elements included in the specific examples described above may be changed as appropriate as long as no technological inconsistency occurs.

What is claimed is:

1. A storage device comprising:
   a first wiring layer;
   a second wiring layer;
   a resistance change layer containing tellurium and disposed between the first wiring layer and the second wiring layer; and
   an adjacent layer containing at least one of a group consisting of germanium, silicon, carbon, tin, aluminum, gallium, and indium and disposed between the second wiring layer and the resistance change layer and adjacent to the resistance change layer in a first direction, wherein
   the resistance change layer is capable of changing between a first state and a second state different from each other in electric resistance,
   the resistance change layer is in a crystal state in any of the first state and the second state, and
   a length of the adjacent layer in a second direction orthogonal to the first direction is shorter than a length of the resistance change layer in the second direction.

2. The storage device according to claim 1, wherein the resistance change layer has a crystal structure having a C axis oriented in the first direction.

3. The storage device according to claim 2, wherein a crystal layer containing transition metal is formed between the resistance change layer and the first wiring layer.

4. The storage device according to claim 1, wherein the resistance change layer has a thickness equal to or larger than 5 nm in the first direction.

5. The storage device according to claim 1, wherein when the resistance change layer is caused to change between the first state and the second state, a voltage pulse with which potential of the first wiring layer becomes higher than potential of the second wiring layer is applied to the resistance change layer and the adjacent layer.

6. A storage device comprising:
   a first wiring layer;
   a second wiring layer;
   a resistance change layer disposed between the first wiring layer and the second wiring layer and having a crystal structure having a C axis oriented in the first direction; and
   an adjacent layer containing a diffusive material that diffuses inside the resistance change layer and disposed between the second wiring layer and the resistance change layer and adjacent to the resistance change layer in a first direction, wherein
   the resistance change layer is capable of changing between a first state and a second state different from each other in electric resistance in accordance with distribution of the diffusive material diffusing from the adjacent layer, and
   the resistance change layer is in a crystal state in any of the first state and the second state.

7. The storage device according to claim 6, wherein a length of the adjacent layer in a second direction orthogonal to the first direction is shorter than a length of the resistance change layer in the second direction.

8. The storage device according to claim 6, wherein the resistance change layer contains tellurium.

9. The storage device according to claim 6, wherein the diffusive material is at least one of a group consisting of germanium, silicon, carbon, tin, aluminum, gallium, and indium.

10. The storage device according to claim 6, wherein the resistance change layer has a thickness equal to or larger than 5 nm in the first direction.

11. The storage device according to claim 6, wherein when the resistance change layer is caused to change between the first state and the second state, a voltage pulse with which potential of the first wiring layer becomes higher than potential of the second wiring layer is applied to the resistance change layer and the adjacent layer.

12. The storage device according to claim 6, wherein a crystal layer containing transition metal is formed between the resistance change layer and the first wiring layer.

13. A storage device comprising:
   a first wiring layer;
   a second wiring layer;
   a resistance change layer disposed between the first wiring layer and the second wiring layer; and
   an adjacent layer containing a diffusive material that diffuses inside the resistance change layer and disposed between the second wiring layer and the resistance change layer and adjacent to the resistance change layer in a first direction, wherein
   the resistance change layer is capable of changing between a first state and a second state different from each other in electric resistance in accordance with distribution of the diffusive material diffusing from the adjacent layer,
   the resistance change layer is in a crystal state in any of the first state and the second state, and
   a length of the adjacent layer in a second direction orthogonal to the first direction is shorter than a length of the resistance change layer in the second direction.

14. The storage device according to claim 13, wherein the resistance change layer contains tellurium.

15. The storage device according to claim 13, wherein the diffusive material is at least one of a group consisting of germanium, silicon, carbon, tin, aluminum, gallium, and indium.

16. The storage device according to claim 13, wherein the resistance change layer has a crystal structure having a C axis oriented in the first direction.

17. The storage device according to claim 16, wherein a crystal layer containing transition metal is formed between the resistance change layer and the first wiring layer.

18. The storage device according to claim 13, wherein the resistance change layer has a thickness equal to or larger than 5 nm in the first direction.

19. The storage device according to claim 13, wherein when the resistance change layer is caused to change between the first state and the second state, a voltage pulse with which potential of the first wiring layer becomes higher than potential of the second wiring layer is applied to the resistance change layer and the adjacent layer.

* * * * *